United States Patent [19]

Riha et al.

[11] Patent Number: 4,521,751
[45] Date of Patent: Jun. 4, 1985

[54] ELECTRONIC COMPONENT FUNCTIONING WITH REFLECTED ACOUSTIC WAVES

[75] Inventors: Gerd Riha, Munich; Richard Veith, Unterhaching, both of Fed. Rep. of Germany

[73] Assignee: Siemens Aktiengesellschaft, Berlin and Munich, Fed. Rep. of Germany

[21] Appl. No.: 520,451

[22] Filed: Aug. 4, 1983

[30] Foreign Application Priority Data

Aug. 17, 1982 [DE] Fed. Rep. of Germany ....... 3230566

[51] Int. Cl.³ .................... H03H 9/25; H03H 9/42; H03H 9/64
[52] U.S. Cl. ............................. 333/151; 310/313 D; 333/194; 333/195
[58] Field of Search .................. 333/150–155, 333/193–196; 310/313 R, 313 A, 313 B, 313 C, 313 D

[56] References Cited

U.S. PATENT DOCUMENTS 3,872,410 3/1975 Zucker ............................. 333/194
4,450,420 5/1984 Buckinx ........................ 310/313 D

*Primary Examiner*—Marvin L. Nussbaum
*Attorney, Agent, or Firm*—Hill, Van Santen, Steadman & Simpson

[57] ABSTRACT

In an electronic component having reflecting structures on a substrate body and functioning with reflected acoustic waves traveling thereon, at least one longitudinal lateral edge of the substrate body is aligned at an angle δ deviation from a direction parallel relative to an acoustic wave emitted by an input transducer. The dimension of the angle δ depends on the arrangement of an output transducer. This construction minimizes the appearance of spurious signals.

9 Claims, 3 Drawing Figures

ELECTRONIC COMPONENT FUNCTIONING WITH REFLECTED ACOUSTIC WAVES

BACKGROUND OF THE INVENTION

The present invention relates to a component functioning with a reflected acoustic wave wherein a substrate body is provided having at least one reflector on the substrate body with reflector fingers disposed at an oblique angle, an input transducer on the substrate body exciting the acoustic wave, and at least one output transducer on the substrate body for receiving acoustic waves.

A filter functioning with reflected acoustic waves is described on the basis of FIG. 7 in German patent application No. P 31 21 516.5 which corresponds to U.S. Ser. No. 377,466, now U.S. Pat. No. 4,427,954, incorporated herein by reference. This filter, in addition to having an input transducer for exciting an acoustic wave in the surface of a substrate body and an output transducer for converting the received acoustic wave also has two reflector structures which have reflector fingers aligned at a respectively oblique angle. The oblique direction of the reflector fingers of the two structures is selected such that the acoustic wave first impinging on the first reflector structure in its primary wave propagation direction from the input transeucer is deflected at an essentially right angle by reflection such that the reflected wave continues in a new primary propagation direction which is essentially orthogonal to the initial primary wave propagation direction. A further deflection caused by reflection occurs in the second reflector structure to create another new primary wave propagation direction along which the acoustic wave now reflected twice proceeds toward the output transducer. In this context, it should be pointed out that given the existence of an anisotropy of the material of the substrate body this applies for example to lithium niobate which is frequently employed), 90° reflections occur when the reflector fingers of the reflecting structure are disposed at an angle relative to the primary wave propagation direction which deviates somewhat from 45°. This is a correction technique well known to one skilled in the art which is to be applied to the invention described in greater detail below, but which shall no longer be discussed in greater detail here. It shall likewise no longer be discussed in detail that as also shown in FIG. 7 of the earlier application, the reflectors need not be entirely filled out with reflector fingers, and/or the reflector fingers are weighted as is described, for example, in earlier German patent applications Nos. P 32 09 942.7 and P 32 09 962.2. It likewise does not seem necessary to point out here that such reflector structures can be realized not only by means of electrode strips applied to the substrate surface, but can also be realized by means of strip-like troughs or trenches introduced into the substrate surface or by means of dot elements (dots) applied in the linear direction. Such dots can in turn be metallizations applied dot-wise or spot-wise to the surface or can be trenches in the surface.

A further electronic component functioning with reflected acoustic waves wherein the present invention can likewise be employed is disclosed in FIG. 7 of German patent application No. P 31 21 516.7, incorporated herein by reference.

In the usual case, a piezo-electric substrate body which has an essentially oblong shape is provided for electronic components functioning with acoustic waves. In order to avoid disruptions due to reflections occurring at the narrow sides, the substrate body has long been given the shape of a parallelogram which has mutually parallel edges at the long sides. A material for damping acoustic waves referred to as an acoustic sink is also frequently provided at the oblique, narrow sides of the substrate body.

SUMMARY OF THE INVENTION

An object of the present invention is to specify a technique for an electronic component as previously described with which a further minimization of the appearance of spurious signals is achieved. This object is achieved by providing a component as previously described such that at least one longitudinal lateral edge of the substrate body which extends along a primary propagation direction of the acoustic wave and proceeding from the input transducer is aligned at an angle $\delta$ deviating from the primary propagation direction and wherein $\delta$ is related to $\frac{1}{2}$ arcsin $(n \cdot \lambda)/a$ where a is the length dimension which is equal to a portion of the aperture of the output transducer acoustically irradiated by the disruptive acoustic wave, $\lambda$ is a wave length of the acoustic wave proceeding at a surface of the substrate body corresponding to a center frequency, and n is a natural number.

The present invention is based on the perception that for an electronic component functioning with reflected acoustic waves where such waves are reflected by a reflector having sector fingers, considerable noise signals occur in the output transducer. These noise signals are based on two successive reflections of the excited acoustic wave at the longitudinal edges of the substrate body which, as is known, are aligned parallel to one another. These reflections can be so great, that a considerably high time-delayed noise signal appears in the output transducer due to further reflection at the second obliquely aligned finger structure. The technique of the invention provides that at least one of the long longitudinal edges of the substrate body is aligned at an angle deviating by an angle $\delta$ from 90° relative to the primary wave propagation angle existing after reflection of the wave at the first reflector structure. The two mutually opposite longitudinal edges of the substrate body are preferably aligned at an angle deviating from 90° relative to the primary wave propagation direction, whereby the size of the two divergent angles is such that said two mutually opposite longitudinal edges of the substrate body are not parallel to one another. In the final analysis, these two mutually opposite longitudinal edges of the substrate body approach one another in wedge-like fashion so that the remaining short longitudinal edges can be aligned as is known not only obliquely relative to one another but also parallel relative to one another.

For the divergent angle $\delta$ or for the divergent angles $\delta_1$ and $\delta_2$ provided for the invention with which these longitudinal edges of the substrate body deviate from the hitherto standard parallelism relative to one another, according to a further feature of the invention $$\delta \text{ or } \delta_1 + \delta_2 \approx \tfrac{1}{2} \text{ arcsin } n\lambda/a$$

where a is a length dimension which is equal to the part of the aperture of the output transducer 5 which is acoustically irradiated by the disruptive acoustic wave 112, $\lambda$ is the wave length of the acoustic wave in the surface of the substrate body corresponding to the center frequency and n is a natural number 1, 2, 3 . . . . Given at least approximate observation of this angle dimensioning, the double reflection of the acoustic wave proceeding at right angles in the substrate body also occurring in the invention is influenced such that no noise signal results in the component of the invention.

The acoustic wave finally proceeding after such double reflections at the longitudinal edges in a direction essentially deviating from the primary wave propagation direction received from the output transducer differs from the exact primary wave propagation direction of reception due to the influence of the one or more divergent angles δ, $δ_1$ and $δ_2$ to such degree that the acoustic wave entering the reception transducer (deviating from the primary wave propagation direction) has such a propagation direction angle that interference in the opto-transducer results which leads to signal cancelling.

The preceding description—for purposes of better understanding—was at least largely conceptionally based on a structure as shown in FIG. 7 of said earlier application. This structure has two reflector structures in which double reflection of the acoustic wave occurs on its path from the input transducer to the output transducer. The present invention, however, can also be employed for an arrangement more rarely employed wherein the input transducer and output transducer are not aligned parallel to one another, but rather are preferably at an essentially right angle relative to one another and only a single obliquely placed reflector structure is provided, i.e. only one directional change of the primary wave propagation direction effected by reflection occurs in the substrate body. The longitudinal edges of the substrate body important in conjunction with the invention are then again those edges which are aligned parallel to the primary wave propagation direction of the acoustic wave first proceeding from the input transducer, and wherein at least one edge according to the invention is aligned non-parallel to the primary wave propagation direction of the input transducer.

DESCRIPTION OF THE PREFERRED EMBODIMENTS

Figure 1:
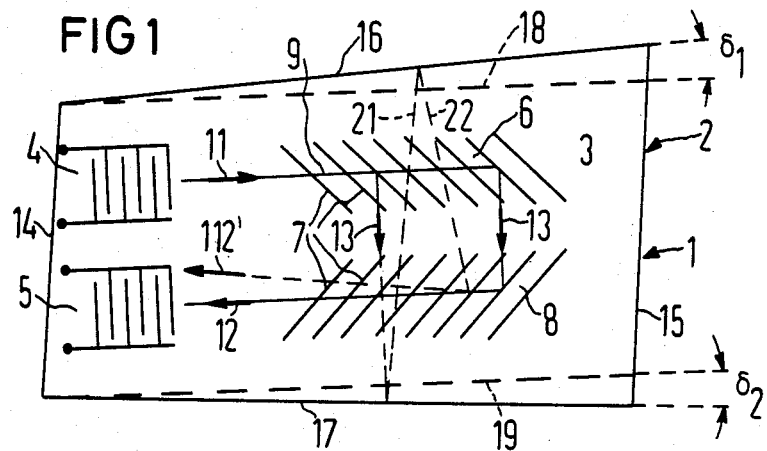
FIG. 1 is a top plan view of a component with acoustic wave sectors on a substrate body having longitudinal edges provided at an angle in accordance with the invention.

FIG. 1 shows a first embodiment 1 of an electronic component according to the invention with a substrate body 2. This substrate body 2 is a relatively flat and long lamina of, for example, lithium niobate.

An input transducer 4 and an output transducer 5 which are interdigital structures provided in a known manner are situated on the surface 3 (visible as an elevation in FIG. 1) of the substrate body. A first reflector structure 6 is formed of a plurality of obliquely placed reflector fingers 7. A second reflector structure 8 has reflector fingers 7. The reflector fingers of the two reflector structures 6 and 8 are aligned relative to one another such that, even taking an anisotropy of the material of the substrate body 2 into consideration, they effect a path 9 of the acoustic wave excited in the input transducer 4 so that waves are reflected toward the output transducer 5. The primary wave propagation direction of the acoustic wave generated in the input transducer 4 is indicated at 11. The intended primary wave propagation direction of the acoustic wave to be received in the output transducer 5 is indicated at 12 and the mutually parallel arrows 13 indicate the primary wave propagation direction which the acoustic wave has after reflection at the first reflector structure 6 and before the second reflection at the further reflector structure 8. With this embodiment, the narrow longitudinal edges 14 and 15 of the substrate body 2 are positioned obliquely (relative to the primary wave propagation directions 11 and 12) in a manner known per se. For the function of the present invention, these edges 14 and 15 could also be orthogonal relative to the primary wave propagation direction 11 or 12. The two longer longitudinal edges 16 and 17 of the substrate body 2 proceed only approximately in the direction of the primary wave propagations 11 and 12 and only approximately orthogonally relative to the primary wave propagation direction 13, thus deviating from the prior art. They are aligned according to the invention at an angle $δ_1$ or $δ_2$ relative to the lines 18 and 19 indicated with broken lines which would be the mutually parallel edges of a substrate body (and parallel to the primary wave propagation directions 11 and 12). The angles $δ_1$ and $δ_2$ need not be of the same size in the invention and one of these angles can also have the value 0, i.e. one of the edges 16 or 17 can coincide with one of the edges 18 or 19.

As a result of reflections discussed in greater detail below, additional undesired disruptive acoustic waves occur in addition to the acoustic waves proceeding as desired on the path 9 between input transducer 4 and output transducer 5.

It has already been pointed out above that after the reflection at the reflector structure 6, the desired acoustic wave propagates in the direction of the primary wave propagation direction 13 with a wave front corresponding in breadth to the reflector structure 6. Given arrangements according to the prior art, the edge of the substrate body merely indicated with the line 19 is orthogonal relative to the direction 13. It has, however, been discovered that a very considerable energy component of the acoustic wave proceeding in the direction 13 proceeds beyond the second reflector structure 8 (given a known arrangement), striking the edge 19 and being reflected back at said edge 19 to the edge 18. Reflection at the edge 18 would cause this undesired component of the acoustic wave which likewise runs with the direction 13 to experience a reflection at the second reflector structure 8. The wave would then proceed into the output transducer 5 parallel to the primary wave propagation 12. It would do this, however, with a time delay which corresponds to the cross-directed back and forth run between the edges 19 and 18. Let it also be pointed out that multiple back and forth runs between the edges 18 and 19 can also occur before a corresponding wave component (given a known arrangement) proceeds in the described manner into the output transducer, as is the case for the desired wave by intent.

Since, given the illustrated sample embodiment of the invention, the edge 17 deviates from the edge 19 at the angle $\delta_2$, a reflection of the wave component which has proceeded beyond the second reflector structure 8 which occurs at the edge 17 no longer occurs toward the opposite edge 16 of the substrate body 2 in a direction of the path 21 parallel to the primary wave propagation direction 13 (but, rather, deviating at the angle $2\cdot\delta_2$). Since this other longitudinal edge 16 of the substrate body 2 is also non-parallel relative to the edge 17, a path 22 of the acoustic wave occurring after reflection at the edge 16 likewise occurs according to the invention in non-parallel fashion relative to the primary propagation direction 13. The acoustic wave following the path 22 strikes the second reflector structure 8 at an angle deviating from the primary propagation direction 13 such that the reflection now appearing at the fingers 7 of the second reflector structure leads to a primary wave propagation direction 112 of said wave component which has an angle deviating from the desired and prescribed primary wave propagation direction 12 by the dimension $2(\delta_1+\delta_2)$ (at least $\delta_1$ or $\delta_2$ differ from 0).

Figure 2:
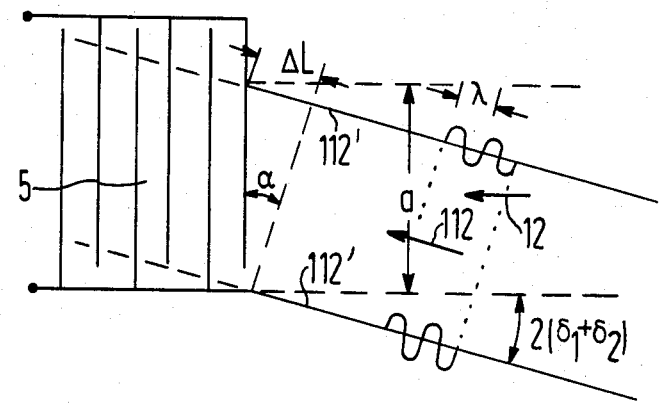
FIG. 2 is a plan view of an output transducer of FIG. 1 and illustrating an incoming wave.

This angle $2(\delta_1+\delta_2)$ is dimensioned such (as can be seen from the illustration of FIG. 2 significantly enlarged in comparison to FIG. 1) that the disruptive wave 112' incident upon the output transducer 5 with the direction 112 experiences cancellation due to interference in said transducer 5. Complete cancellation of the disruptive wave 112' is achieved here when the angle $\delta = 2(\delta_1+\delta_2)$ is dimensioned with sin $\alpha = \Delta L/a = (n\cdot\lambda)/a$. A correspondingly reduced cancellation of the wave 112' occurs when this angular relationship is not exactly observed. The number n can have the value of a natural number 1, 2, 3 .... The angle deviations $\delta_1$ and/or $\delta_2$ can be smallest for n=1, i.e. the wedge-shaped substrate body 2 according to the invention deviates least in terms of dimensions from a substrate body having the edges 18 and 19 present in a component (and 14 and 15). The angles $\delta_1$ and/or $\delta_2$ are correspondingly larger for n=2, 3 .... On the other hand, these angles then need not be as exactly observed in order to nonetheless achieve at least largely complete cancellation according to the invention (see FIG. 2).

Let it be pointed out that it is sufficient for the realization of the invention when at least the edge 16 or at least the edge 17 deviates from the parallel edges 18 and 19 by an angle $\delta$.

Figure 3:
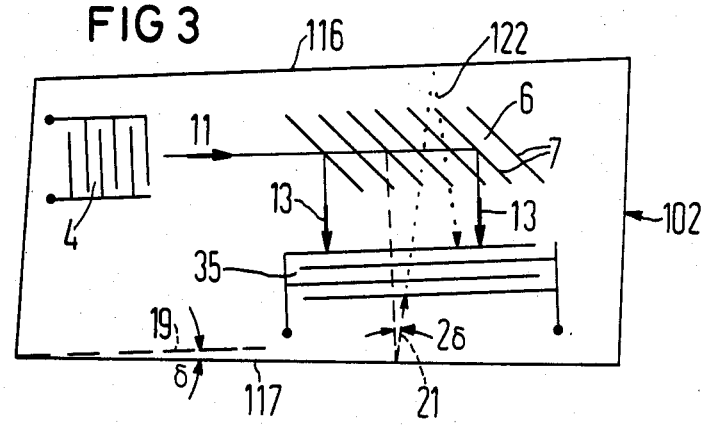
FIG. 3 is a plan view of a further embodiment of the invention of FIG. 1.

FIG. 3 shows an embodiment of the invention wherein the output transducer (as can be seen from this Figure) is disposed at right angles relative to the input transducer 4 and wherein only one reflector structure 6 and thus only one directional change of the primary wave propagation direction from the direction 11 to the direction 13 occurs. The radiation deflected to the direction 13 is incident upon the output transducer 35 and generates the desired electric signal there. A component of the wave in direction 13, however, is reflected at the edge 117 of the substrate body 102 lying behind the output transducer 35. Since this edge 117 exhibits according to the invention the angle $\delta$ relative to the orthogonal of the direction 13, i.e. the direction of said edge 117 proceeds in non-perpendicular fashion relative to the direction 13 by the angle $\delta$, the reflected wave 121 now proceeds into the output transducer 35 from the back and which is at an angle $\delta$, and is subjected there to cancellation due to interference. With this embodiment, at least the edge adjacent to the output transducer 35 must have the angle $\delta$. The radiation reflected at the longitudinal edge 116 and proceeding on the path 122 illustrated with dots likewise impinges upon the output transducer 35 deviating from the direction 13 (although the edge 116 in this embodiment is parallel to the direction 11 of the wave of the input transducer 4).

Although various minor changes and modifications might be proposed by those skilled in the art, it will be understood that we wish to include within the claims of the patent warranted hereon all such changes and modifications as reasonably come within our contribution to the art.

We claim as our invention:

1. An electronic component functioning with a reflected acoustic wave, comprising: a substrate body; at least one reflector means on the substrate body with reflector fingers disposed at an oblique angle relative to a propagation direction of an incoming primary acoustic wave; an input transducer means on the substrate body exciting the acoustic wave; at least one output transducer means on the substrate body having an acoustic wave receiving aperture; the substrate body having two opposite longitudinal edges extending along a primary propagation direction of the acoustic wave proceeding from the input transducer means; a disruptive weave being emitted from said reflector means and being reflected at the opposite edges; and at least one of the opposite edges being aligned at an angle $\delta$ deviating from said primary propagation direction so that the opposite edges are non-parallel to one another, and wherein $\delta$ is related to $\frac{1}{2}$ arcsin $(n\cdot\lambda)/a$ where a is a length dimension of given length units which is equal to that portion of the aperture of the output transducer means acoustically irradiated by the disruptive acoustic wave, $\lambda$ is a wave length of the acoustic wave in the same length units as a and proceeding at a surface of the substrate body corresponding to a center frequency, and n is a natural number.

2. A component according to claim 1 wherein only one of the longitudinal lateral edges of the substrate body extending along the primary propagation direction deviates by the angle $\delta$ and $\alpha = \frac{1}{2}$ arcsin $(n\cdot\lambda)/a$.

3. A component according to claim 1 wherein two longitudinal lateral edges of the substrate body extending along the primary propagation direction each deviate by respective angles $\delta_1$ and $\delta_2$, and wherein $\delta_1+\delta_2 = \frac{1}{2}$ arcsin $(n\cdot\lambda)/a$.

4. A component according to claim 1 wherein n=1.

5. A component according to claim 1 wherein n is a natural number greater than 1 but smaller than 10.

6. A component according to claim 1 wherein given an arrangement of the input transducer means and of the output transducer means with an angle of their respective transmission of reception direction relative to one another deviating from parallelism, at least that longitudinal lateral edge of the substrate body lying adjacent to a back of the output transducer means being aligned at said angle $\delta$.

7. An electronic component functioning with a reflected acoustic wave, comprising: a substrate body; first and second reflector means on the substrate body with reflector fingers disposed at an oblique angle relative to a respective propagation direction of an incoming primary acoustic wave; an input transducer means on the substrate body exciting the acoustic wave toward the first reflector means; at least one output transducer means on the substrate body having an acoustic wave receiving aperture and receiving acoustic waves from the second reflector means; the substrate body having two opposite longitudinal edges extending along a primary propagation direction of the acoustic wave proceeding from the input transducer means; a disruptive wave being emitted from said reflector means and being reflected at the opposite edges; and the opposite edges being aligned at respective angles $\delta_1$ and $\delta_2$ deviating from said primary propagation direction so that the opposite edges are non-parallel to one another, and wherein $\delta_1 + \delta_2 = \frac{1}{2}$ arcsin $(n \cdot \lambda)/a$ where a is a length dimension of given length units which is equal to that portion of the aperture of the output transducer means acoustically irradiated by the disruptive acoustic wave, $\lambda$ is a wave length of the acoustic wave in the same length units as a and proceeding at a surface of the substrate body corresponding to a center frequency, and n is a natural number.

8. An electronic component functioning with a reflected acoustic wave, comprising: a substrate body; first and second reflector means on the substrate body with reflector fingers disposed at an oblique angle relative to a propagation direction of a respective incoming primary acoustic wave; an input transducer means on the substrate body exciting the acoustic wave toward the first reflector means; at least one output transducer means on the substrate body having an acoustic wave receiving aperture and receiving acoustic waves from the second reflector means; the substrate body having two opposite longitudinal edges extending along a primary propagation direction of the acoustic wave proceeding from the input transducer means; a disruptive wave being emitted from said reflector means and being reflected at the opposite edges; and at least one of the opposite edges being aligned at a respective angle $\delta$ deviating from said primary propagation direction so that the opposite edges are non-parallel to one another and wherein $\delta = \frac{1}{2}$ arcsin $(n \cdot \lambda)/a$ where a is a length dimension of given length units which is equal to that portion of the aperture of the output transducer means acoustically irradiated by the disruptive acoustic wave, $\lambda$ is a wave length of the acoustic wave in the same length units as a and proceeding at a surface of the substrate body corresponding to a center frequency, and n is a natural number.

9. An electronic component functioning with a reflected acoustic wave, comprising: a substrate body; a reflector means on the substrate body with reflector fingers disposed at an oblique angle relative to a propagation direction of an incoming primary acoustic wave; an input transducer means on the substrate body exciting the acoustic wave toward the reflector means; at least one output transducer means on the substrate body having an acoustic wave receiving aperture and receiving acoustic waves from the reflector means; the substrate body having two opposite longitudinal edges extending along a primary propagation direction of the acoustic wave proceeding from the input transducer means; a disruptive wave being emitted from said reflector means and being reflected at the opposite edges; and at least one of the opposite edges being aligned at a respective angle $\delta$ deviating from said primary propagation direction so that the opposite edges are non-parallel to one another and wherein $\delta = \frac{1}{2}$ arcsin $(n \cdot \lambda)/a$ where a is a length dimension of given length units which is equal to that portion of the aperture of the output transducer means acoustically irradiated by the disruptive acoustic wave, $\lambda$ is a wave length of the acoustic wave in the same length units as a and proceeding at a surface of the substrate body corresponding to a center frequency, and n is a natural number.

* * * * *